(12) United States Patent
Ragab et al.

(10) Patent No.: US 9,401,726 B2
(45) Date of Patent: Jul. 26, 2016

(54) BACKGROUND CALIBRATION OF TIME-INTERLEAVED ANALOG-TO-DIGITAL CONVERTERS

(71) Applicant: Silicon Laboratories Inc., Austin, TX (US)

(72) Inventors: Kareem A. Ragab, Austin, TX (US); John Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/554,790

(22) Filed: Nov. 26, 2014

(65) Prior Publication Data
US 2016/0149582 A1    May 26, 2016

(51) Int. Cl.
| | |
|---|---|
| H03M 1/10 | (2006.01) |
| H03M 1/06 | (2006.01) |
| H03M 1/12 | (2006.01) |
| H03M 1/00 | (2006.01) |

(52) U.S. Cl.
CPC .......... *H03M 1/1023* (2013.01); *H03M 1/0626* (2013.01); *H03M 1/121* (2013.01); *H03M 1/124* (2013.01); *H03M 1/00* (2013.01); *H03M 1/0695* (2013.01); *H03M 1/12* (2013.01); *H03M 2201/4233* (2013.01)

(58) Field of Classification Search
CPC ....... H03M 1/12; H03M 1/00; H03M 1/0695; H03M 2201/4233
USPC .......................... 341/120, 155, 118, 161, 166
See application file for complete search history.

(56) References Cited

U.S. PATENT DOCUMENTS

| | | | |
|---|---|---|---|
| 5,239,299 A | 8/1993 | Apple et al. | |
| 7,148,828 B2 | 12/2006 | Fernandez et al. | |
| 7,283,074 B2 * | 10/2007 | Sheng ................. | H03M 1/1014 341/120 |
| 7,330,140 B2 | 2/2008 | Balakrishnan et al. | |
| 2012/0075129 A1 * | 3/2012 | Kidambi ............. | H03M 1/1052 341/118 |
| 2012/0262318 A1 | 10/2012 | Straayer et al. | |

OTHER PUBLICATIONS

Black, W.C. and Hodges, D.A., "Time Interleaved Converter Arrays," IEEE Journal of Solid-State Circuits, vol. SC-15, No. 6, Dec. 1980, pp. 1022-1029.
El-Chammas, M. and Murmann, B., "A 12-GS/s 81-mW 5-bit Time-Interleaved Flash ADC with Background Timing Skew Calibration," IEEE Journal of Solid-State Circuits, vol. 46, No. 4, Apr. 2011, pp. 838-847.
Kurosaws, N. et al., "Explicit Analysis of Channel Mismatch Effects in Time-Interleaved ADC Systems," IEEE Transactions on Circuits and Systems I, Fundamental Theory and Applications, vol. 48, No. 3, Mar. 2001 pp. 261-271.

(Continued)

*Primary Examiner* — Joseph Lauture
(74) *Attorney, Agent, or Firm* — Abel Law Group, LLP (57) ABSTRACT

A robust and fast background calibration technique for correction of time-interleaved ADC offset, gain, bandwidth, and timing mismatches is proposed. The technique combines the use of a calibration signal and a reference ADC. The calibration signal enhances robustness and makes the technique independent of the input signal's statistics. The reference ADC speeds up convergence and enables the use of a small amplitude calibration signal that does not significantly reduce the input signal dynamic range. The calibration signal can be subtracted or filtered from the ADC output and is therefore invisible to the ADC user.

23 Claims, 10 Drawing Sheets

(56) References Cited

OTHER PUBLICATIONS

Janssen et al., "An 11b 3.6GS/s Time-Interleaved SAR ADC in 65nm CMOS," ISSCC 2013, Session 26, High-Speed Data Converters/26.2, Feb. 2013, 3 pages.

Jin, H. and Lee, E.K.F., "A Digital-Background Calibration Technique for Minimizing Timing-Error Effects in Time-Interleaved ADC's," IEEE Transactions on Circuits and Systems II, Analog and Digital Signal Processing, vol. 47, No. 7, Jul. 2000, pp. 603-613.

Jamal, S.M. et al., "A 10-b 120-Msample/s Time-Interleaved Analog-to-Digital Converter with Digital Background Calibration," IEEE Journal of Solid-State Circuits, vol. 37, No. 12, Dec. 2002, pp. 1618-1627.

Liu, W., and Chiu, Y., "Time-Interleaved Analog-to-Digital Conversion with Online Adaptive Equalization," IEEE Transactions on Circuits Systems I, Regular Papers, vol. 59, No. 7, Jul. 2012, pp. 1384-1395.

Stepanovic, D. and Nikolic, B., "A 2.8 GS/s 44.6 mW Time-Interleaved ADC Achieving 50.9 dB SNDR and 3 dB Effective Resolution Bandwidth of 1.5 GHz in 65 nm CMO," IEEE Journal of Solid-State Circuits, vol. 48, No. 4, Apr. 2013, pp. 971-982.

McNeill, J.A. et al., "Split ADC Calibration for All-Digital Correction of Time-Interleaved ADC Errors," IEEE Transactions on Circuits and Systems II, Express Briefs, vol. 56, No. 5, May 2009, pp. 344-348.

Razavi, B., "Design considerations for Interleaved ADCs," IEEE Journal of Solid-State Circuits, vol. 48, No. 8, Aug. 2013, pp. 1806-1817.

\* cited by examiner

BACKGROUND CALIBRATION OF TIME-INTERLEAVED ANALOG-TO-DIGITAL CONVERTERS

BACKGROUND

1. Field of the Invention

This application relates to analog-to-digital converters and more particularly to calibration of time-interleaved analog-to-digital converters.

2. Description of the Related Art

High speed analog-to-digital converters (ADCs) are key building blocks to applications such as software defined radio and TV tuners. A software defined TV tuner requires a high speed ADC that fully captures the cable TV signal which spans the frequency band 50 MHz-1 GHz. Such a high speed ADC should provide around 60 dB of signal to noise and distortion ratio (SNDR) while operating at a sampling frequency ($f_s$) of 3~4 gigasamples (GS)/s.

Figure 1:
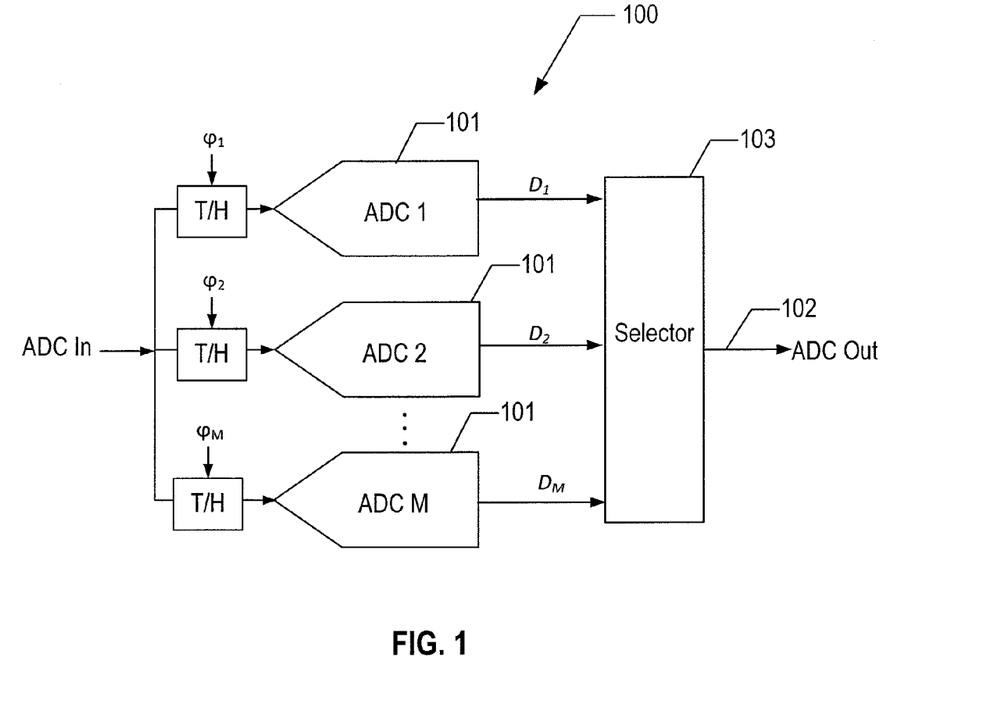
FIG. 1 illustrates a time interleaved analog-to-digital converter.

Referring to FIG. 1, a high speed analog to digital converter 100 can be efficiently achieved by interleaving a number (M) of sub-ADCs 101. In various embodiments of analog to digital converters, the ADC tracks the input signal (ADC In) for a period of time and then holds the tracked signal for conversion to digital and that operation is referred to as track and hold. The sample clocks shown as ($\phi_1, \phi_2, \ldots, \phi_M$) in FIG. 1 control the track and hold operation. The sampled analog value may be held, e.g., in a capacitive circuit, and supplied to conversion circuitry to convert the analog signal to digital over a sample period. The sampling instant ($\phi_1, \phi_2, \ldots, \phi_M$) of each sub-ADC 101 is ideally offset by one ADC sampling clock period ($T_s$) from the preceding sub-ADC. That effectively supplies the input to one of the M sub-ADCs at a time. Interleaving allows more conversion time of ($MT_s$) for each sub-ADC. The sub-ADC digital outputs ($D_1, D_2, \ldots, D_M$) are finally combined (i.e. interleaved) to generate the full-rate ADC output 102 using selector 103. The interleaved architecture allows each sub-ADC to run at a lower speed of $f_{clk}=f_s/M$ which simplifies the sub-ADC design, where $f_s$ is the full-rate ADC sampling frequency. Assuming the sub-ADCs perfectly match, the time-interleaved ADC operates seamlessly like a single high-speed ADC.

Figure 2:
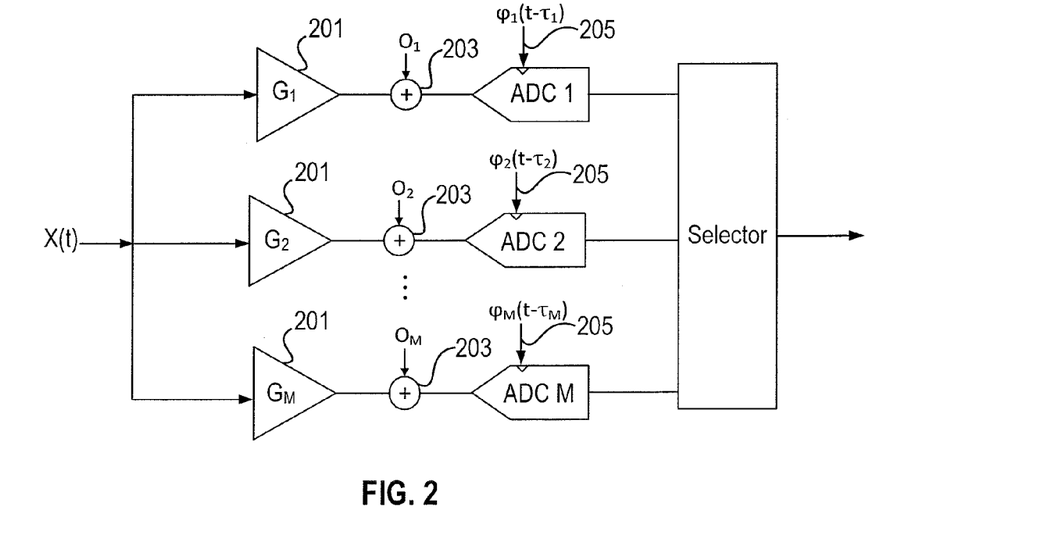
FIG. 2 illustrates a model of mismatches for a time-interleaved analog-to-digital converter.

In practice, sub-ADCs have mismatch in their offset, gain, bandwidth, and sampling instant. FIG. 2 shows a model for a time-interleaved ADC with gain mismatches ($G_i$) 201, offset mismatches ($O_i$) 203, and timing mismatches ($\phi_i(t-\tau_i)$) 205. Such mismatches cause conversion errors and introduce spurs in the ADC output. Offset mismatch adds a fixed pattern to the ADC output that repeats every M samples. That pattern is input-signal independent and introduces spurs at frequencies $Nf_s/M$, $N=1, \ldots, M-1$. Gain mismatch modulates the input signal amplitude and introduces spurs at $Nf_s/M\pm f_{in}$ where $f_{in}$ is the frequency of the input signal. The magnitude of these spurs is proportional to the input signal amplitude. Similarly, timing mismatch modulates the phase of the input signal and introduces spurs at $Nf_s/M\pm f_{in}$. The amplitude of these spurs is a function of the input signal derivative, which for a sinusoidal input is proportional to both its amplitude and frequency. While gain errors are frequency independent, timing errors are more significant for high frequency inputs, and hence are typically the dominant error source for high speed designs.

Bandwidth mismatch introduces both gain mismatch and delay mismatch that are frequency dependent. For sufficiently wide input track-and-hold (T/H) bandwidth and moderate mismatches, the frequency dependence of the delay mismatch can be ignored to a first order, and therefore it can be treated as a fixed timing skew. That is similar to clock skew, but here the signal itself is being delayed rather than the clock. As for gain mismatch, its significance depends on the application. For single tone inputs, the gain error would be significant for high frequency inputs. For wide band inputs, e.g. cable TV signal, the input contains lower high frequency content and therefore less gain error would be generated due to this gain mismatch. Additionally, if a large interleaving factor (M), e.g. 64, is used, this would ensure that the gain error power is distributed across the whole TV band and has a lower power spectral density. Therefore, the gain error contribution to each TV channel band becomes small. That is opposed to using a small interleaving factor and having the gain error power concentrated within a small band of channels.

In general, mismatches can be calibrated either in foreground or background. In foreground calibration, calibration occurs while analog signals are not otherwise being processed. Background calibration occurs during system operation while analog signals are being converted to digital for system use. Background calibration is often necessary for achieving high resolution, given its ability to track voltage and temperature variations. Background calibration of timing errors is the most challenging and remains a topic of active research.

In general, calibration of an interleaved ADC involves two steps, namely, detection and correction of mismatch errors. As for timing calibration, correction of timing skew mismatch can be achieved either in the analog domain using programmable delay elements, or in the digital domain using adaptive digital filters. The analog approach is less complex and has been adopted in most practical implementations. As for timing skew mismatch detection, a number of techniques exist. These techniques can be classified into three categories: i) Calibration signal based, ii) Reference ADC based, iii) Input signal statistics based. A sawtooth calibration signal with period $(M+1)T_s/N$ may be added to the input signal. Assuming zero offset for each sub-ADC, the average of each sub-ADC output can be used as a measure of its timing skew. As the input signal represents large uncorrelated noise source for the measurement of timing skew error, the sawtooth amplitude has to be large for reasonable convergence time. That decreases signal dynamic range. Therefore, a trade-off exists between signal dynamic range and convergence speed. In one prior art approach, the calibration signal occupied 25% of the ADC full scale.

In the second category, a reference ADC, without a calibration signal, is used to enable fast convergence for the calibration algorithm. The timing error of sub-ADC k, referred to as $ADC_k$, is taken as the difference between the reference ADC and $ADC_k$ outputs. As the input signal is common to both outputs, it gets cancelled and therefore less averaging and faster convergence is possible. Unlike the previous category where an input calibration signal with a known derivative was used, the input signal derivative has to be estimated in this second category. That may be done using analog derivative estimators, or digital derivative estimators, with the former approach being more accurate. While the use of a reference ADC speeds up convergence, the dependence on the input signal statistics for measurement of timing error can slow down convergence.

In the third approach, timing error is detected from the cross correlation of sub-ADC outputs. For example, a reference ADC may be used and cross correlation is performed between each sub-ADC and the reference. In another approach, cross-correlation is performed between sub-ADC outputs eliminating the need for a reference ADC. Advantage of this technique is that it does not require a calibration signal and it also simplifies the implementation of the reference ADC. However, the drawback is that it places restrictions on the input signal and also its convergence time is a function of input signal activity.

Thus, improvements in background calibration are desirable.

SUMMARY

A robust background calibration technique for time-interleaved ADCs with high convergence speed may be achieved via the combined use of a reference ADC and preferably a small calibration signal. The small calibration signal does not significantly decrease the input signal dynamic range. The calibration signal can be removed from the ADC output making the entire calibration process invisible to the ADC user.

In one embodiment, a time interleaved analog-to-digital converter (ADC) includes a reference ADC coupled to receive an analog input signal combined with a calibration signal and a plurality of sub-ADCs coupled to receive the analog input signal combined with the calibration signal. The sub-ADCs sample the analog input signal combined with the calibration signal using respective sample clock signals. A plurality of calibration circuits are coupled to the reference ADC and respective ones of the sub-ADCs to determine respective timing errors between the reference ADC and the sub-ADCs and to provide respective timing mismatch estimates.

In another embodiment a method of calibrating an interleaved analog-to-digital (ADC) converter includes combining an input analog signal and a calibration signal. A plurality of sub-ADCs sample the combined analog signal using respective sample clock signals and generate sub-ADC digital signals corresponding to the sampled combined analog input signal and calibration signal. The reference ADC samples the combined analog input signal and the calibration signal using a reference ADC sample clock signal and generates a reference ADC digital signal. The sub-ADC digital signals and the reference ADC digital signal are supplied to respective calibration circuits and calibration signals and the calibration circuits determine calibration signals in the respective calibration circuits to reduce timing error, offset error, and gain error between the reference ADC and respective sub-ADCs.

In another embodiment a time interleaved analog-to-digital converter (ADC) includes a reference ADC coupled to receive an analog input signal combined with a calibration signal and sample the combined analog input signal and calibration signal using a reference clock signal and supply a reference digital signal corresponding to the sampled signal. A sub-ADC receives the analog input signal combined with the calibration signal and samples the analog input signal combined with the calibration signal using a sub-ADC sample clock signal and supplies a sub-ADC digital signal corresponding to the sampled signal. A timing control loop determines a timing error between the reference ADC and the sub-ADC and generates a timing mismatch estimate. The timing control loop further includes a clock deskew circuit responsive to the timing mismatch estimate to reduce timing error between the reference ADC and the sub-ADC. An offset error control loop determines an offset mismatch estimate based on the difference between the sub-ADC digital signal and the reference ADC digital signal and uses the offset mismatch estimate in determining the sub-ADC digital signal. A gain control loop determines a gain error based on the difference between output signal power of the reference ADC and output signal power of the sub-ADC and generates a gain mismatch estimate based on the gain error. The gain control loop further includes an adjustable gain circuit responsive to the gain mismatch estimate to reduce gain error between the reference ADC and the sub-ADC.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 3:
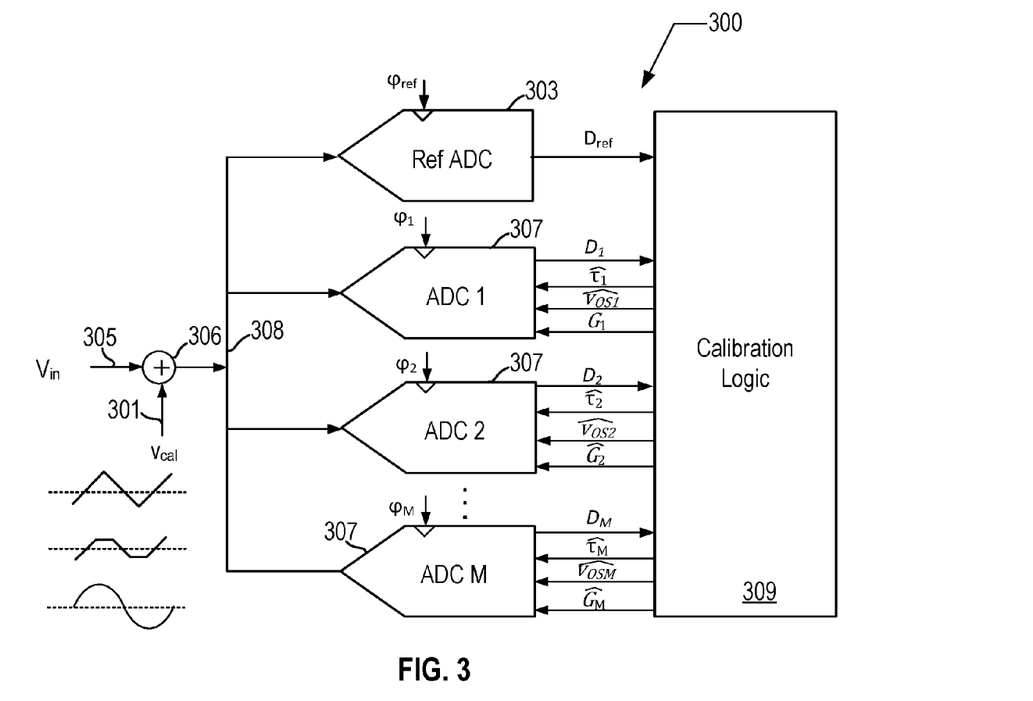
FIG. 3 illustrates a high level block diagram of an embodiment of a time-interleaved analog-to-digital converter using a calibration signal and a reference ADC.

Referring to FIG. 3, a high level block diagram illustrates an embodiment of a time interleaved analog-to-digital converter 300 that combines the use of a calibration signal 301 and a reference ADC 303. The small periodic calibration signal 301, which may be, e.g., a sinusoidal, triangle wave, or other waveform, is added to the input signal 305 at the node shown as a summer 306 to form a sum 308 of the input signal and the calibration signal. The reference ADC 303 and the sub-ADCs 307 sample the sum 308. Calibration logic 309, which includes a plurality of calibration control loops for each sub-ADC, reduces mismatches present in the ADC 300 as explained further herein. The calibration circuitry generates for each sub-ADC a timing mismatch estimate $\hat{t}_i$, an offset mismatch estimate $\widehat{v_{os_i}}$ and a gain mismatch estimate $\hat{G}_i$, which mismatch estimates are explained further herein. In embodiments described herein, the timing mismatch estimate for each sub-ADC corrects the timing of the sub-ADC in the analog domain and the other mismatch estimates are used to correct the sub-ADC output in the digital domain.

Figure 4:
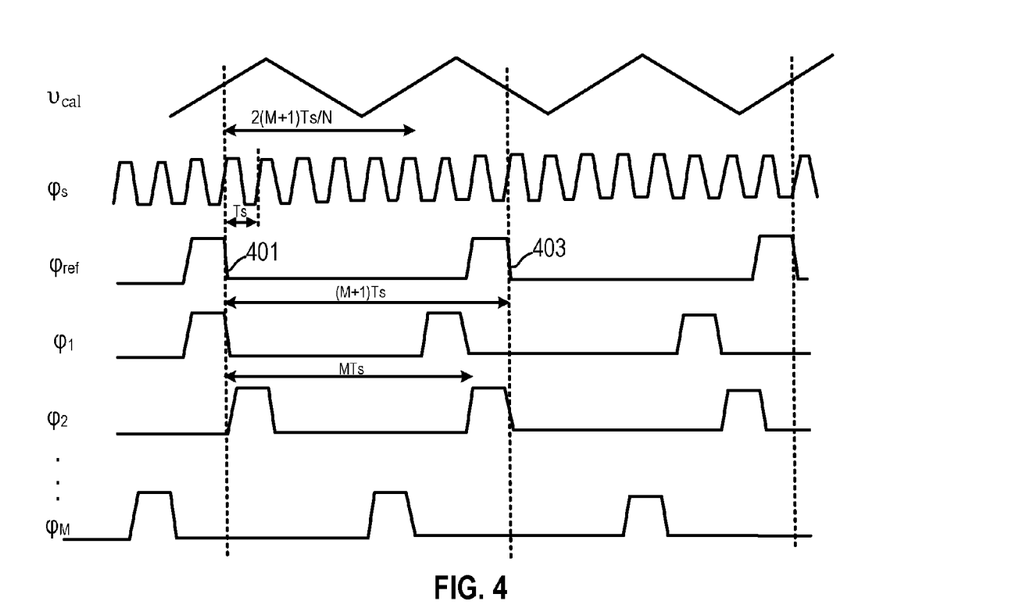
FIG. 4 illustrates a timing diagram associated with the embodiment of FIG. 3.

FIG. 4 illustrates a timing diagram associated with the embodiment of FIG. 3. The reference ADC is clocked at $f_s/(M+1)$, where M is the interleaving factor, $f_s$ is the sampling frequency of ADC 300. The clock frequency of the reference ADC is chosen such that its sampling instance coincides with that of each of the time-interleaved sub-ADCs in a round robin fashion as shown in FIG. 4. Thus, the reference ADC samples at 401 at the same time that clock $\phi_1$ causes sub-ADC 1 to sample the sum of the input signal and the calibration signal. As can be seen in FIG. 4, the next sampling instance at 403 coincides with sampling clock $\phi_2$ that causes sub-ADC 2 to sample the sum of the input signal and the calibration signal. As can also be seen in FIG. 4, the sampling in the illustrated embodiment occurs at zero crossing of the calibration signal. The calibration signal is alternately rising and falling at each successive sampling instance. In FIG. 4, N is a positive integer and the frequency of the calibration waveform can be increased by increasing N.

FIG. 4 illustrates a triangle wave is used for the calibration signal, but in principle and as shown in FIG. 3, other periodic calibration signals may be used. There are several possibilities for the choice of frequency of the calibration signal. In one embodiment, the frequency of the calibration signal is chosen to be [0.5K/(M+1)] fs, where K is a positive odd integer and M is odd, such that its positive and negative zero-crossing edges alternate with the sampling instances of the reference ADC. Alternatively, the frequency can be chosen to be [k/(M+1)] fs, where k is a positive integer. In that case, the calibration signal should be chopped to alternate the positive and negative edges such that successive sampling instances for each sub-ADC, of samples that should ideally align with the reference and used for calibration, sees alternating positive and negative edges. Alternating the positive and negative edges eliminates DC offset differences between the reference ADC and the sub-ADC from the timing calibration loop. Otherwise offset errors will cause erroneous timing corrections as explained further herein.

The calibration signal should experience a track/hold (T/H) delay equal to that experienced by the input signal. Additionally, the reference ADC 303 is used to remove the input signal from the error measurement. That enables fast convergence and allows the use of a small amplitude calibration signal. In the embodiment of FIG. 3, it is assumed that the T/H bandwidth is large enough (~6 GHz), the bandwidth mismatch is small enough (<3% RMS). That assumption is made in typical practical implementations. The T/H bandwidth is often designed to be wide enough such that gain mismatch errors as a function of frequency can be ignored and the delay mismatch can be assumed to be fixed and hence treated as a timing skew mismatch and calibrated by the timing skew calibration loop. Note that this assumption is easier to meet for wideband inputs, e.g. a cable TV signal, and large interleaving factors, e.g., 64 sub-ADCs.

Figure 5A:
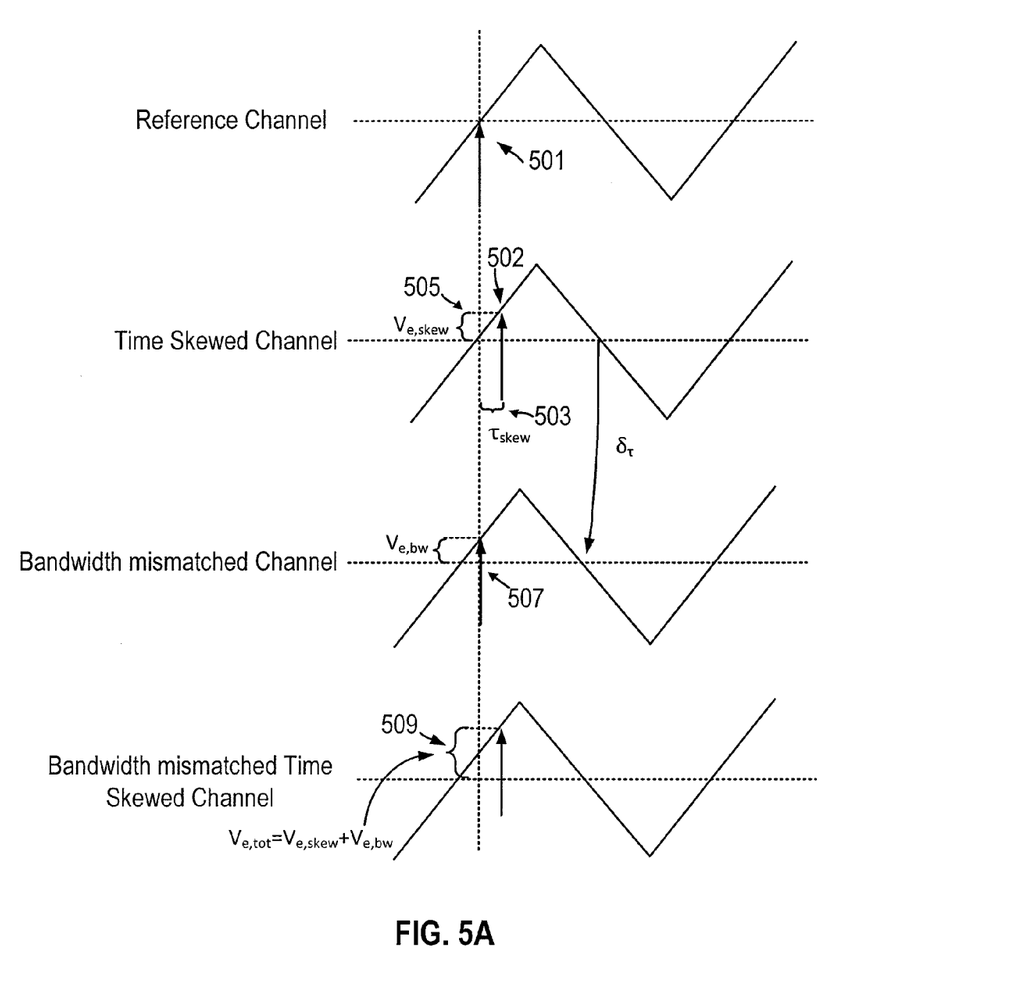
FIG. 5A illustrates error voltage generation due to delay in clock (skew mismatch), delay in signal (bandwidth mismatch), and the combined effect of clock skew and bandwidth mismatch.

During the input tracking period, the triangle wave is equivalent to a positive or a negative ramp and hence it gets delayed by the input T/H time constant. Therefore, the calibration signal captures any timing skew due to bandwidth mismatch. Any bandwidth mismatch or clock timing skew converts to a difference between the outputs of the reference and sub-ADC under calibration, as shown in FIG. 5A. Referring to FIG. 5A, the reference ADC samples the triangle wave at 501. If the sub-ADC being calibrated has a timing skew, the sub-ADC samples the triangle wave at 502 due to a timing skew as reflected at 503. The timing skew causes the sub-ADC to sample the positive ramp higher on the ramp resulting in a voltage error at 505 shown as voltage error $V_{e,skew}$. The voltage error is the difference in voltage sampled by the sub-ADC being calibrated and the voltage sampled by the reference ADC. Bandwidth mismatch results in a relative time delay to the signal as illustrated by $\delta_\tau$, but not a delay in the sampling clocks, and the sample at 507 with bandwidth mismatch results in a voltage error shown as $V_{e,bw}$ in FIG. 5A. Finally, a bandwidth mismatch combined with a time skewed channel results in a voltage error $V_{e,tot}=V_{e,skew}+V_{e,bw}$ as shown at 509 because the sub-ADC samples higher on the positive ramp of the triangle wave due to both kinds of errors.

Figure 5B:
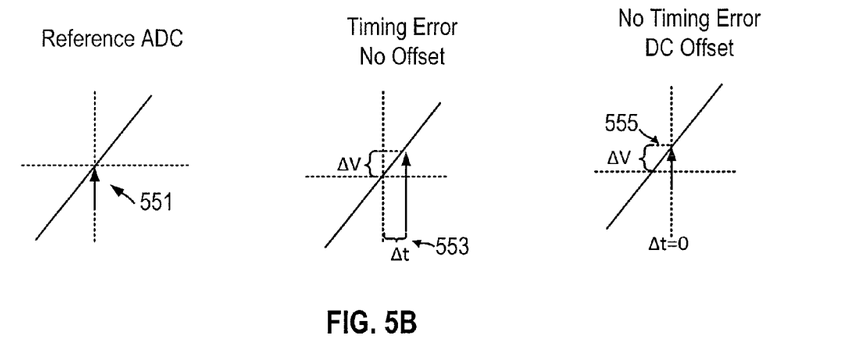
FIG. 5B illustrates why the voltage errors caused by offset and timing errors can not be separated with a non-alternating calibration signal.
Figure 5C:
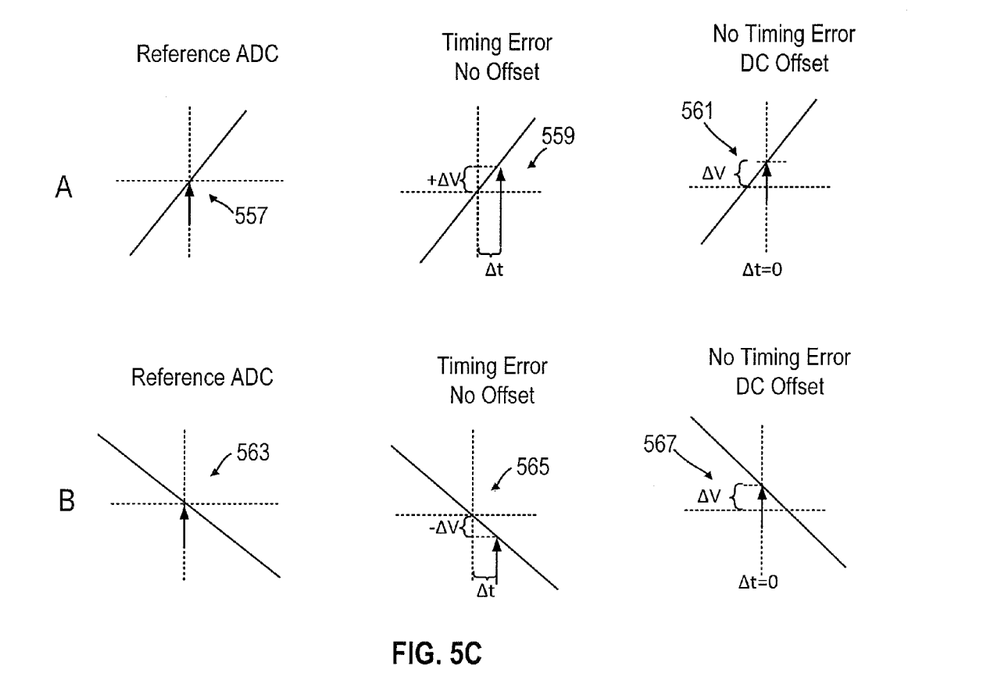
FIG. 5C illustrates how alternating the calibration signal allows timing errors and offset errors to be separated.

FIG. 5B and FIG. 5C illustrate the benefits of having the calibration signal alternate. In FIG. 5B the reference ADC samples at 551. A timing offset error $\Delta t$ in the sampling clock of the sub-ADC shown at 553 results in a voltage error of $\Delta V$. A DC offset error at 555 also results in a voltage error of $\Delta V$. The $\Delta V$ error caused by timing offset cannot be distinguished from the $\Delta V$ error caused by the DC offset. That prevents the timing loop from converging until the offset loop converges and the offset loop from converging until the timing loop converges. Thus, a non-alternating calibration signal can result in slow and unstable convergence of the timing and offset control loops.

FIG. 5C illustrates how the timing errors and offset errors can be distinguished if the positive and negative edges of the calibration signal alternates. In the waveforms labeled "A", the reference ADC samples at 557 with a positive going slope. If there is a timing error, the sub-ADC samples at 559 and if there is an offset error, the sub-ADC samples at 561. In the waveforms labeled "B" the reference ADC samples a negative going calibration signal at 563. A timing error shown at 565 results in an error of $-\Delta V$. A DC offset shown in 567 results in a positive $\Delta V$. After two samples with alternating positive and negative slopes for the calibration signal, the timing accumulator content equals $\Delta V - (-\Delta V) = 2 \Delta V$. In contrast, the offset accumulator after two samples equals $\Delta V - (\Delta V) = 0$. Thus, offset errors and timing errors can be distinguished and the alternating positive and negative edges allows the timing control loop, described further herein, to converge without being affected by offset errors.

Figure 6:
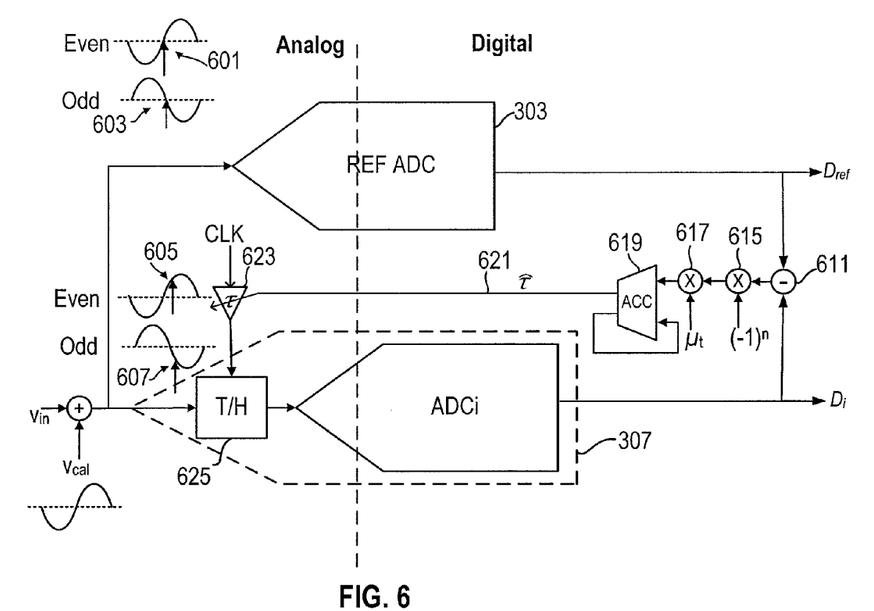
FIG. 6 illustrates a high level block diagram of an embodiment of a control loop for background timing mismatch calibration.

Referring to FIG. 4, again, the timing error signal is periodically chopped appearing as a positive error at 401 for even samples and a negative error at 403 for odd samples for the same timing or bandwidth errors. That is also shown in FIG. 6 at 601 for a sine wave calibration signal where the reference ADC samples at 601 on the positive slope of the sine wave for even samples and on the negative slope of the sine wave at 603 for odd samples. If the timing skew is positive, that results in a positive error for even samples (605) and a negative error for odd samples shown at 607 for the sub-ADC on consecutive samples.

FIG. 6 also illustrates a high level model of the timing control loop to reduce timing errors between the reference ADC and the sub-ADCs. By adjusting all the sub-ADCs to match the reference ADC, timing mismatch between the sub-ADCs is reduced. The digital value Di from the sub-ADC 307 (ADC i) is subtracted from the digital value Dref from the reference ADC 303 in subtraction circuit 611. The timing error signal is then chopped in 615 so all the timing error signals have the same polarity. The error signal is then multiplied by a least mean squares (LMS) gain constant $\mu_t$ in multiplier 617 and accumulated in accumulator 619. The gain constant may be kept small to help ensure convergence. The output 621 of the accumulator 619 is the estimate ($\hat{\tau}$) of the timing mismatch and controls the clock deskew circuit 623 to minimize timing error between the sub-ADC being calibrated and the reference ADC. The clock deskew circuit may be implemented using programmable delay elements, controlled based on the estimate of the timing mismatch. Note that the T/H block 625 is shown separately from the sub-ADCi in order to illustrate timing correction. The T/H block is not shown explicitly for the reference ADC 303 for ease of illustration. If not shown explicitly, the T/H block is implicit, e.g., in the various sub-ADCs shown as 307 in FIG. 3 and the reference ADC 303. Thus, the LMS adaptive loop shown in FIG. 6 adjusts the timing instant of the sub-ADC under calibration to match that of the reference ADC by minimizing the timing error signal using programmable delay elements for the timing deskew. Each sub-ADC has a timing control loop.

Figure 7:
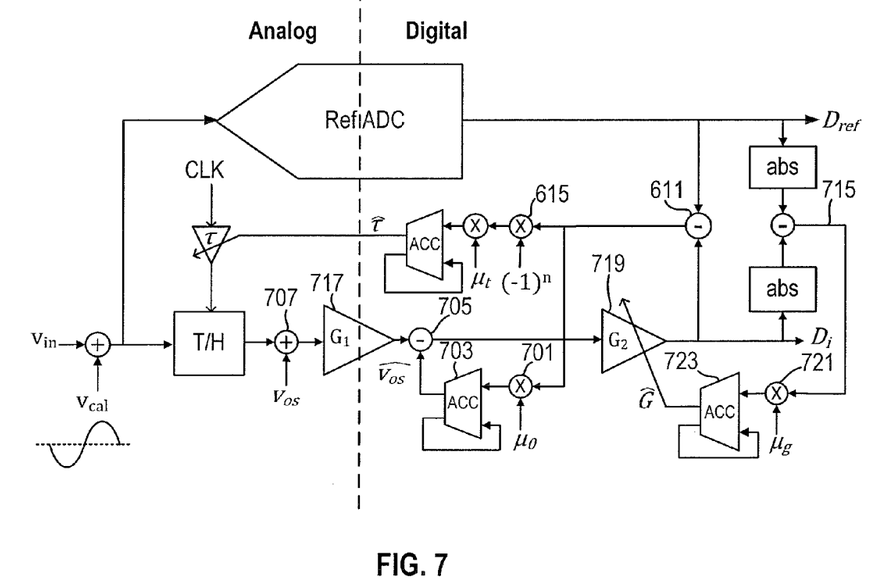
FIG. 7 illustrates a high level block diagram of an embodiment of control loops for complete background calibration including an offset control loop, a gain control loop, and the timing control loop shown in FIG. 6.
Figure 8:
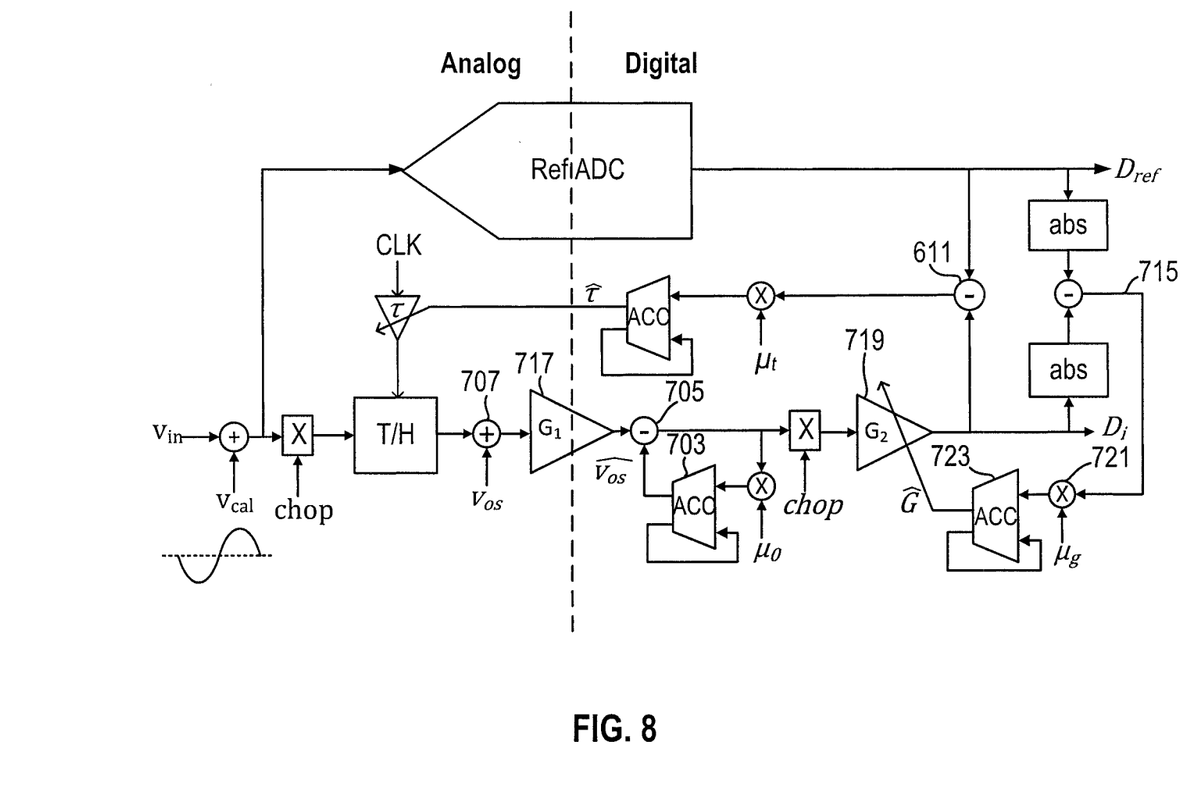
FIG. 8 illustrates an alternative embodiment in which chopping is applied to the analog input for offset cancellation.

FIG. 7 illustrates a high level block diagram of an embodiment of control loops for complete background calibration including an offset control loop, a gain control loop, and the timing control loop shown in FIG. 6. Offset mismatch error can be obtained from the average of the difference of the reference ADC and sub-ADC outputs. In the embodiment illustrated in FIG. 7, an LMS loop corrects the offset of the sub-ADC under calibration forcing the offset error signal to zero. The loop utilizes the difference between the reference ADC and the sub-ADC being calibrated provided by subtractor 611 as the error signal. The error signal is then multiplied by a least mean squares (LMS) gain constant $\mu_o$ in multiplier 701 and accumulated in accumulator 703. The output of the accumulator 703 is the estimate ($\widehat{v_{os}}$) of the offset mismatch and is subtracted from the digital output of the sub-ADC being calibrated in subtractor 705. Note that the offset of the sub-ADC being calibrated is represented by the offset voltage $v_{os}$ being added at the summing node 707. Note that because the timing error signal is chopped at the sub-ADC output, it does not interfere with the offset calibration loop. Thus, chopping decouples offset measurements from timing measurements so the measurements become orthogonal. Each sub-ADC has an offset control loop. Alternatively, chopping could be applied to the analog input instead of the timing error signal, such that the timing and offset calibration loops do not interfere, as shown in FIG. 8. However chopping the analog input adds to the analog complexity. Further, chopping the T/H circuit modulates its bandwidth which could interfere with and complicate timing correction.

Finally, an LMS loop is used to adjust the gain of the sub-ADC to match that of the reference ADC by driving the gain error signal to zero. The gain error signal 715 is taken as the difference between the absolute value of the reference ADC and sub-ADC, as a measure of the difference in the output signal powers. The gain of the sub-ADC is modeled in FIG. 7 by gain G1 717 that represents a fixed gain of the analog domain and an adjustable gain G2 719 in the digital domain. The gain error signal 715 is multiplied by a least mean squares (LMS) gain constant $\mu_g$ in multiplier 721 and accumulated in accumulator 723. The output of the accumulator 723 is the estimate ($\hat{G}$) of the gain mismatch which is used to scale the signal to adjust the gain after the offset correction is made in summing circuit 705. Each sub-ADC has a gain control loop. The calibrated Di signal is supplied as the output of the calibrated sub-ADC.

Figure 9A:
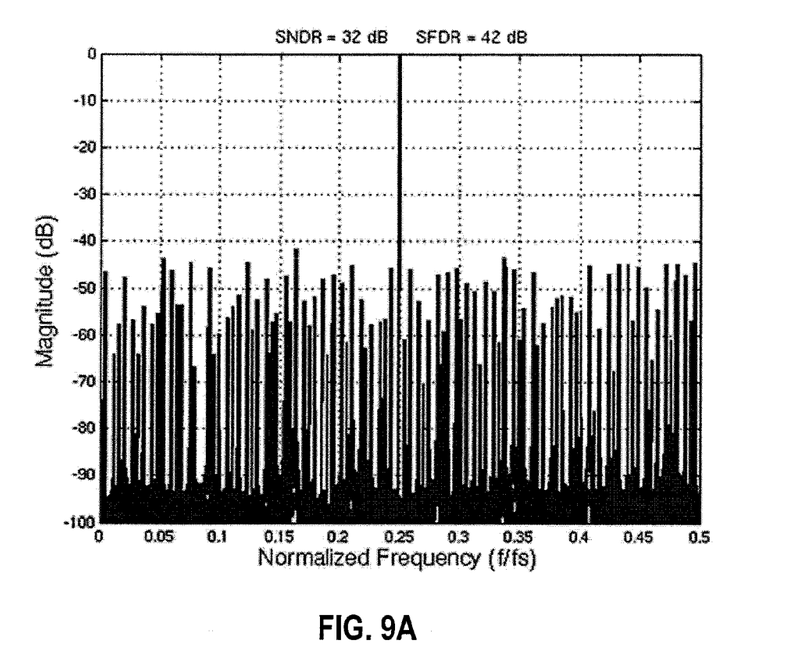
FIGS. 9A and 9B show the ADC output spectrum before and after calibration for a single tone input.
Figure 9B:
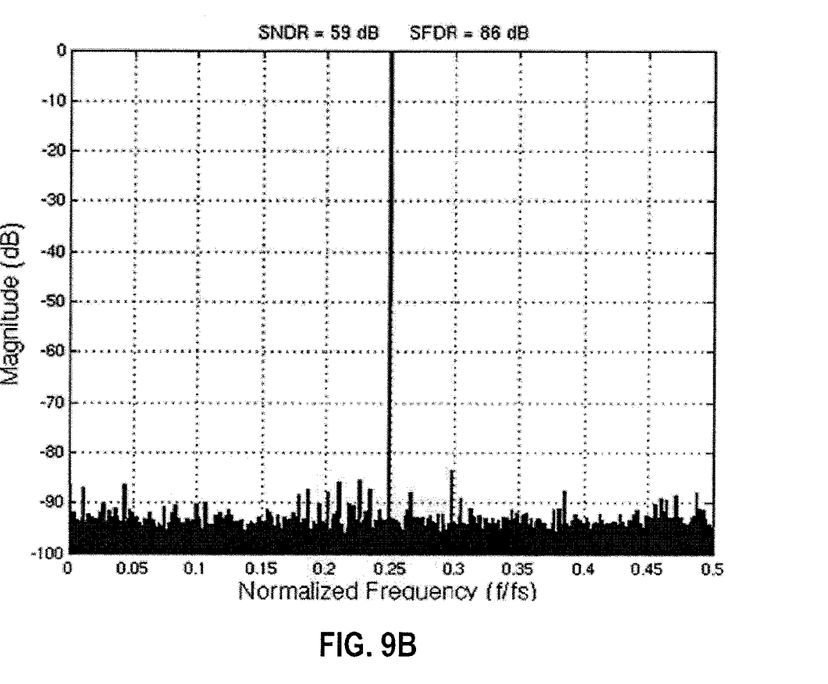
Figure 10A:
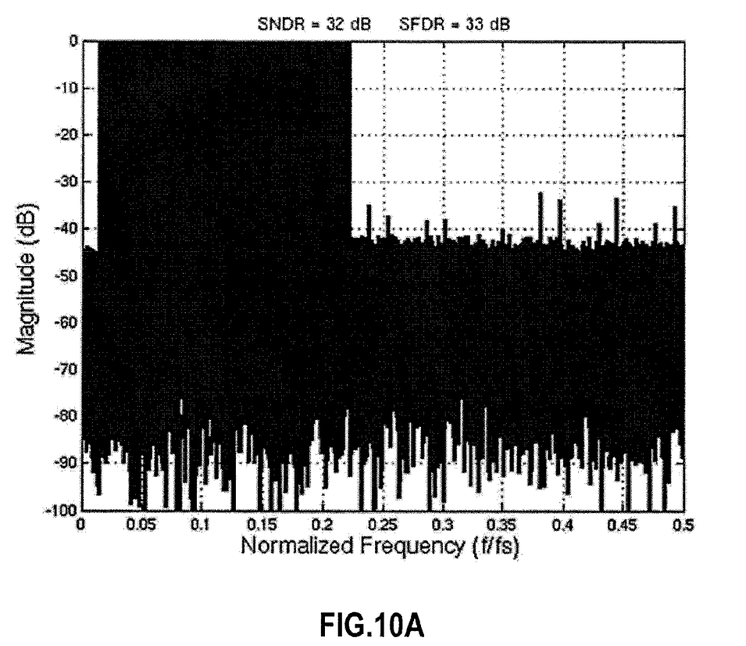
FIGS. 10A and 10B show the ADC output spectrum before and after calibration for a multi-tone input.
Figure 10B:
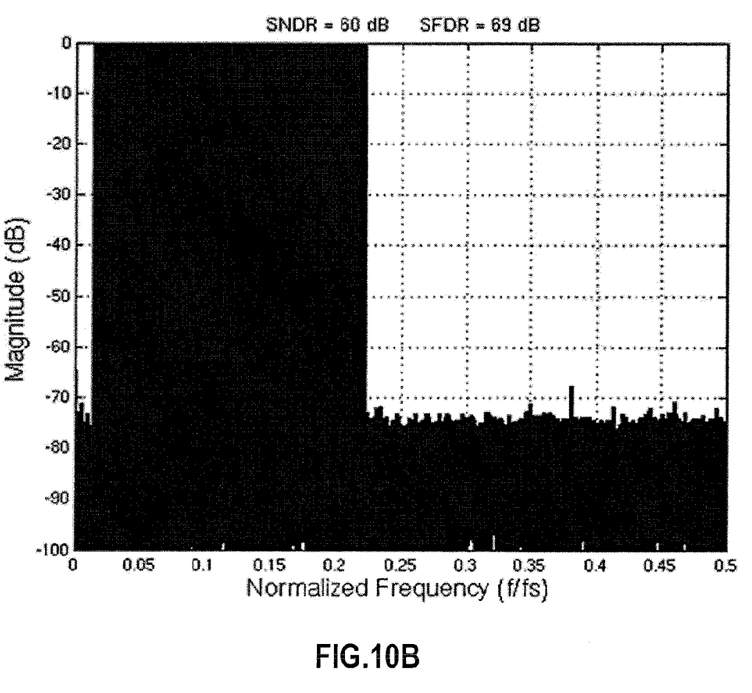
Figure 11A:
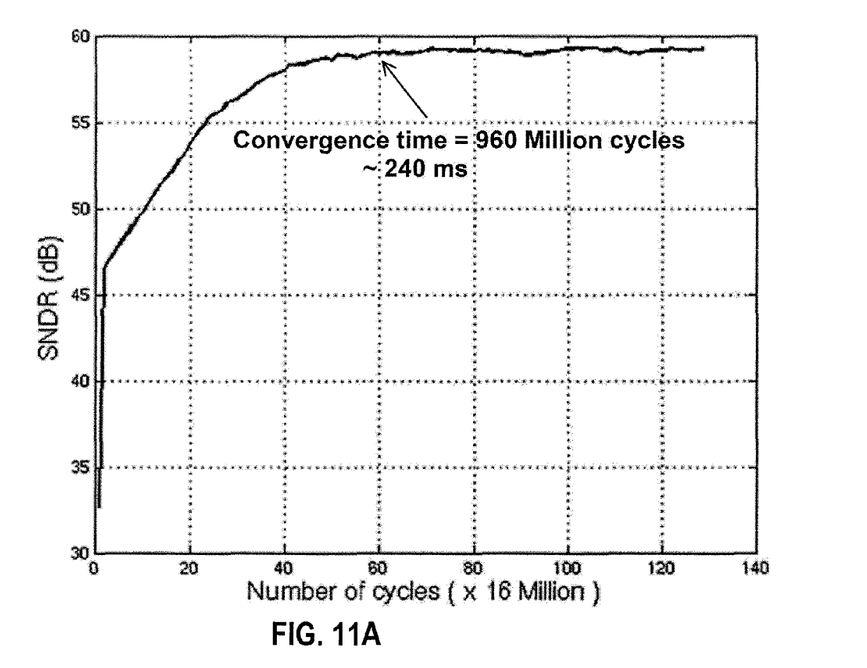
FIG. 11A illustrates improvement in SNDR using calibration techniques described herein.
Figure 11B:
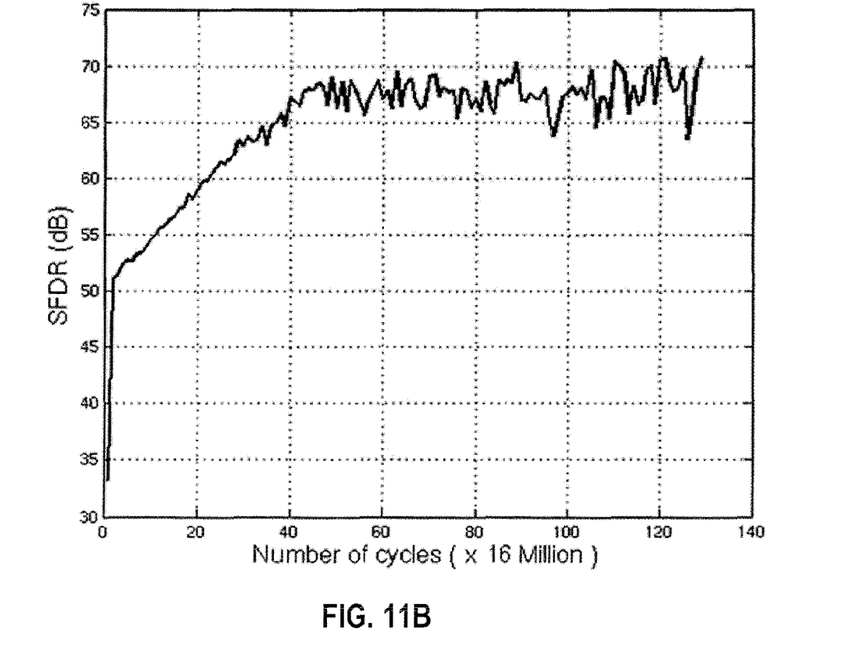
FIG. 11B illustrates improvement in SFDR using calibration techniques described herein.

Each sub-ADC has its own set of calibration loops. All loops run in parallel and in an independent fashion. After convergence, all sub-ADCs have the same offset, gain, and timing skew as that of the reference ADC and mismatches are minimized. Simulation results showing the output spectrum of a 4 GS/s 64-way interleaved ADC before and after calibration are shown for two cases: i) Single tone input (FIGS. 9A (before) and 9B (after)) and ii) Multi tone input (FIGS. 10A (before) and 10B(after)). For both cases, Signal to Noise plus Distortion Ratio (SNDR) is improved to near its thermal noise limit (~60 dB) as shown in FIG. 11A, which shows that all mismatch errors power has been reduced to an insignificant level. FIG. 11B shows spurious free dynamic range (SFDR) is improved by about 40 dB. FIGS. 11A and 11B show evolution of ADC SNDR and SFDR over time for an exemplary simulation. Convergence is achieved within 240 ms while using a 10 mV$_{pp}$ calibration signal. The technique is applied for the calibration of a 64-way interleaved ADC operating at approximately 4 GS/s. Offset, gain, and timing error powers are reduced to −78 dBc, −78 dBc, and −75 dBc respectively after calibration.

One advantage of the calibration scheme described herein is that the calibration signal power can be small. Therefore, the calibration signal power does not significantly corrupt the ADC output. Furthermore, for some applications, e.g., cable TV applications, the calibration signal frequency can be chosen to be below the frequency band of interest such that the high frequency harmonics of the calibration signal that fall inside the frequency band of interest are below the largest tolerable spur. However, the reduction of the calibration signal frequency increases convergence time. Alternatively, the calibration signal frequency can be chosen to be higher than the upper band frequency and also in such a way that its aliased high frequency harmonics are below the spur level requirement for the desired signal. A higher calibration signal frequency enables faster convergence speed. Further, if the frequency of the calibration signal is outside of the frequency band of interest of the ADC input signal, e.g., above or below the frequency band 50 MHz-1 GHz for TV, and the spurs due to harmonics are tolerable, the calibration signal can otherwise be ignored and does not need to be subtracted from the sub-ADC output signals. The calibration signal at the ADC output can simply be filtered out with digital signal processing since the frequency is outside of the desired passband.

Figure 12:
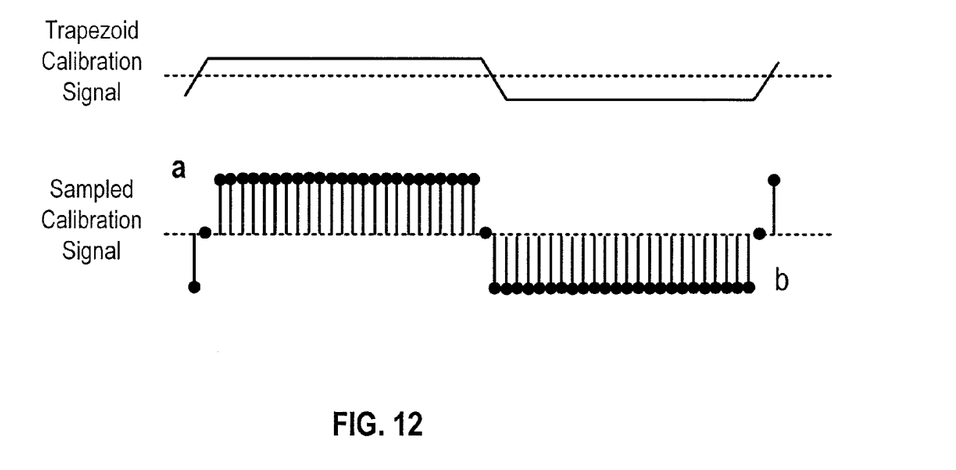
FIG. 12 illustrates a trapezoidal wave calibration signal.
Figure 13:
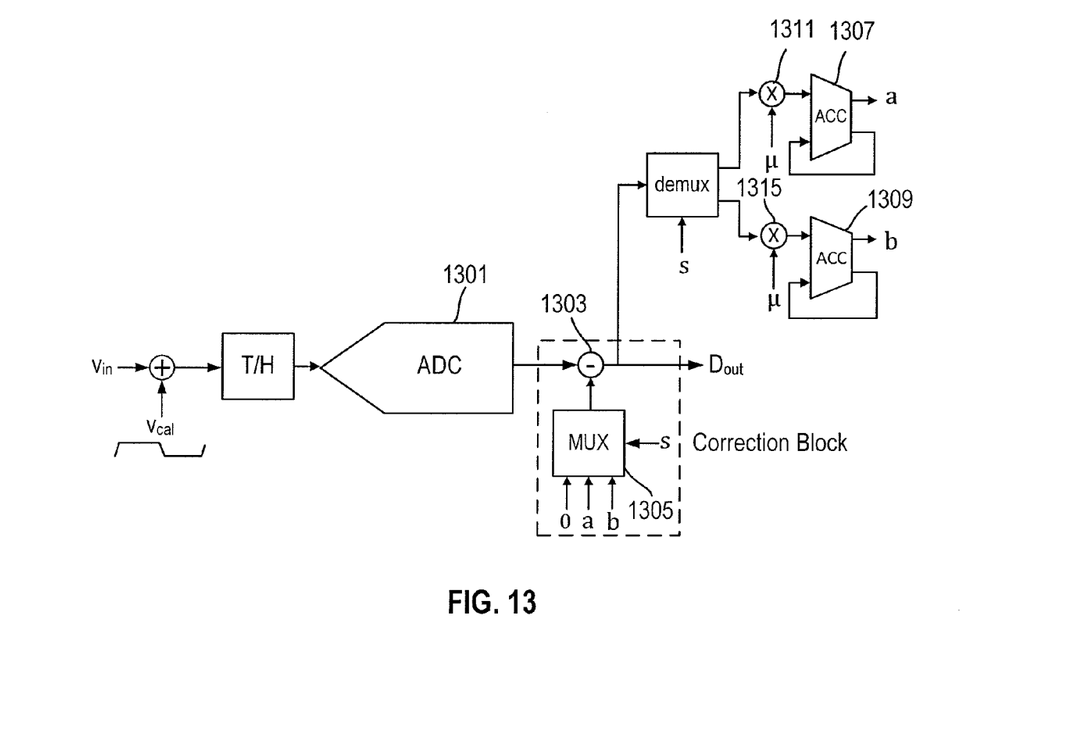
FIG. 13 illustrates an embodiment to remove the calibration signal of FIG. 12.

Another approach, rather than having the calibration signal be outside of the frequency band of interest, estimates and removes the calibration signal from the ADC output in the digital domain. That allows higher flexibility in the selection of calibration signal frequency. Additionally, removing the calibration signal from the ADC in the digital domain allows greater flexibility in applying calibration as described herein to other applications. For instance, FIG. 12 shows a trapezoid wave calibration signal and its sampled waveform. That sampled signal can be easily estimated and removed from the ADC output using the embodiment shown in FIG. 13. In the embodiment illustrated in FIG. 13 ADC 1301 supplies its output to subtraction circuit 1303, which subtracts the error estimate (0, a, or b) selected by multiplexer 1305. The control signal S is determined by the frequency of the trapezoidal waveform, which is known. The corrected output D$_{OUT}$ is supplied to the accumulators 1307 or 1309 after multiplication by a least mean squares (LMS) gain constant $\mu$ in multipliers 1311 and 1315. The embodiment in FIG. 13 utilizes an LMS algorithm to converge to successfully subtract the calibration signal from the ADC output.

The use of a calibration signal increases calibration robustness and makes calibration independent of the input signal statistics. No assumptions are placed on the input signal, therefore the technique is general. The use of a reference ADC greatly relaxes the trade-off between calibration signal amplitude and convergence time allowing the use of a low-level calibration signal while achieving fast convergence. Various embodiments allow different approaches for eliminating the calibration signal from the ADC output and hence it becomes invisible to the ADC user. Finally, chopping of timing error decouples the timing and offset calibration loops. While the various embodiments have been described herein as particularly useful for background calibration, the various embodiments can also be used in foreground calibration, with, e.g., a single tone input signal.

Thus, various aspects have been described relating to calibration of an interleaved ADC. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A time interleaved analog-to-digital converter (ADC) comprising:
    a reference ADC coupled to receive an analog input signal combined with a calibration signal;
    a plurality of sub-ADCs coupled to receive the analog input signal combined with the calibration signal, the sub-ADCs configured to sample the analog input signal combined with the calibration signal using respective sample clock signals; and
    a plurality of calibration circuits coupled to the reference ADC and respective ones of the sub-ADCs, each of the calibration circuits being configured to determine respective timing errors between the reference ADC and the sub-ADCs and to provide respective timing mismatch estimates; and
    wherein each of the calibration circuits are further configured to adjust a gain of an associated sub-ADC to match a gain of the reference ADC.

2. The time interleaved analog-to-digital converter (ADC) as recited in claim 1 further comprising a plurality of clock deskew circuits for respective sub-ADCs, coupled to receive respective ones of the timing mismatch estimates to adjust a sampling timing of the respective sub-ADCs in the analog domain to match timing of the reference ADC.

3. The time interleaved analog-to-digital converter (ADC) as recited in claim 1 wherein the determined timing errors reflect clock skew between a reference ADC sample clock used to sample the analog input signal combined with the calibration signal and respective sub-ADC sample clocks.

4. The time interleaved analog-to-digital converter (ADC) as recited in claim 1 wherein the calibration circuits are further configured-to correct DC offset errors between the reference ADC and the respective sub-ADCs.

5. The time interleaved analog-to-digital converter (ADC) as recited in claim 1 further comprising for each of the sub-ADCs:
    a DC offset control loop to reduce offset error between a sub-ADC and the reference ADC;
    a gain control loop to reduce gain error between the sub-ADC and the reference ADC; and
    a timing control loop to reduce timing error between the sub-ADC and the reference ADC.

6. The time interleaved analog-to-digital converter (ADC) as recited in claim 5 wherein the offset control loop, the gain control loop, and the timing control loop are controlled independently for each of the sub-ADCs.

7. The time interleaved analog-to-digital converter (ADC) as recited in claim 5 wherein the offset control loop, the gain control loop and timing control loop are least mean squares (LMS) adaptive control loops.

8. The time interleaved analog-to-digital converter (ADC) as recited in claim 1 wherein the calibration signal is a sine wave, a triangle wave, or a trapezoidal signal.

9. The time interleaved analog-to-digital converter (ADC) as recited in claim 1 wherein the analog input signal has a first bandwidth of interest and a frequency of the calibration signal is below the first bandwidth.

10. The time interleaved analog-to-digital converter (ADC) as recited in claim 1 wherein the analog input signal has a first bandwidth of interest and a frequency of the calibration signal is above the first bandwidth.

11. A method of calibrating an interleaved analog-to-digital converter (ADC) comprising:
    combining an analog input signal and a calibration signal;
    sampling the combined analog input signal and calibration signal in a plurality of sub-ADCs using respective sample clock signals and generating sub-ADC digital signals corresponding to the sampled combined analog input signal and calibration signal;
    sampling the combined analog input signal and calibration signal in a reference ADC using a reference ADC sample clock signal and generating a reference ADC digital signal;
    supplying the sub-ADC digital signals and the reference ADC digital signal to respective calibration circuits;
    determining calibration signals in the respective calibration circuits used to reduce timing error, DC offset error, and gain error between the reference ADC and respective sub-ADCs; and
    reducing the gain error by matching adjusting a gain of the sub-ADCs to match a gain of the reference ADC.

12. The method as recited in claim 11 wherein determining the calibration signals further comprises, for each of the respective sub-ADCs:
    determining in a timing control loop a difference between a sub-ADC digital signal and the reference ADC digital signal and supplying an estimate of a timing mismatch signal based on the difference to an analog deskew circuit to reduce timing error between the sub-ADC and the reference ADC.

13. The method as recited in claim 12 further comprising:
    chopping the difference between the sub-ADC digital signal and the reference ADC digital signal;
    multiplying the chopped difference with a gain constant;
    accumulating the multiplied chopped difference and supplying an accumulator output, and
    supplying the accumulated output signal as the estimate of the timing mismatch signal to adjust the analog deskew circuit.

14. The method as recited in claim 12 further comprising for each of the respective sub-ADCs:
    determining an offset mismatch estimate based on the difference between the sub-ADC digital signal and the reference ADC digital signal in an offset control loop and subtracting the offset mismatch estimate in determining the sub-ADC digital signal.

15. The method as recited in claim 14 further comprising for each of the respective sub-ADCs in a gain control loop:
    comparing output signal power of the reference ADC to output signal power of the sub-ADC to determine a gain error;
    generating a gain mismatch estimate based on the gain error; and adjusting a variable gain circuit based on the gain mismatch estimate to match the gain of each sub-ADC to the gain of the reference ADC.

16. The method as recited in claim 15 further controlling the offset control loop, the gain control loop, and the timing control loop independently.

17. The method as recited in claim 11 further comprising supplying as the calibration signal a sine wave, a triangle wave, or a trapezoidal wave.

18. The method as recited in claim 11 wherein the analog signal has a first bandwidth and a frequency of the calibration signal is above or below the first bandwidth.

19. The method as recited in claim 11 wherein a frequency of the calibration signal is $(0.5K/(M+1))fs$, where K is a positive odd integer, M is a number of sub-ADCs and is odd, and fs is a sampling frequency of the interleaved ADC.

20. The method as recited in claim 11 wherein a frequency of the calibration signal is $(K/(M+1))fs$, where K is a positive integer, M is a number of sub-ADCs, and fs is a frequency of the interleaved ADC; and the method further comprising chopping the calibration signal to alternate the positive and negative edges of the calibration signal.

21. The method as recited in claim 11 further comprising performing the calibrating as background calibration.

22. The method as recited in claim 11 further comprising:
removing an estimate of the calibration signal from a digital signal of the interleaved ADC.

23. A time interleaved analog-to-digital converter (ADC) comprising:

a reference ADC coupled to receive an analog input signal combined with a calibration signal and sample the combined analog input signal and calibration signal using a reference clock signal and supply a reference digital signal;

a sub-ADC coupled to receive the analog input signal combined with the calibration signal, the sub-ADC configured to sample the analog input signal combined with the calibration signal using a sub-ADC sample clock signal and supply a sub-ADC digital signal; and a timing control loop to determine a timing error between the reference ADC and the sub-ADC and generate a timing mismatch estimate, the timing control loop further including a clock deskew circuit responsive to the timing mismatch estimate to reduce timing error between the reference ADC and the sub-ADC;

an offset error control loop to determine an offset mismatch estimate based on the difference between the sub-ADC digital signal and the reference ADC digital signal and use the offset mismatch estimate in determining the sub-ADC digital signal; and a gain control loop to determine a gain error based on a difference between output signal power of the reference ADC and output signal power of the sub-ADC and to generate a gain mismatch estimate based on the gain error, the gain control loop further including an adjustable gain circuit responsive to the gain mismatch estimate to reduce gain error between the reference ADC and the sub-ADC.

* * * * *